(12) United States Patent
Kuno et al.

(10) Patent No.: US 7,732,037 B2
(45) Date of Patent: *Jun. 8, 2010

(54) CONDUCTIVE POROUS MATERIAL, RESIN MOLDING DIE EMPLOYING THE SAME, AND METHOD OF PREPARING CONDUCTIVE POROUS MATERIAL

(75) Inventors: Takaki Kuno, Kyoto (JP); Keiji Maeda, Kyoto (JP); Yoshinori Noguchi, Kyoto (JP); Satoshi Kitaoka, Nagoya (JP); Naoki Kawashima, Nagoya (JP)

(73) Assignees: Towa Corporation, Kyoto (JP); Japan Fine Chemicals Center, Aichi (JP)

( * ) Notice: Subject to any disclaimer, the term of this patent is extended or adjusted under 35 U.S.C. 154(b) by 951 days.

This patent is subject to a terminal disclaimer.

(21) Appl. No.: 10/557,003

(22) PCT Filed: Jan. 25, 2005

(86) PCT No.: PCT/JP2005/000902

§ 371 (c)(1),
(2), (4) Date: Nov. 16, 2005

(87) PCT Pub. No.: WO2005/075380

PCT Pub. Date: Aug. 18, 2005

(65) Prior Publication Data

US 2006/0286346 A1 Dec. 21, 2006

(30) Foreign Application Priority Data

Feb. 9, 2004 (JP) .............................. 2004-031678

(51) Int. Cl.
*B32B 3/24* (2006.01)
*C04B 38/02* (2006.01)
*B29C 33/38* (2006.01)

(52) U.S. Cl. ................. 428/131; 428/304.4; 428/307.3; 428/307.7; 428/312.6; 428/317.9; 428/450; 428/698; 264/29.1; 264/44; 264/610; 55/282.2; 55/282.3; 501/84

(58) Field of Classification Search ................. 428/131, 428/304.4, 307.3, 307.7, 312.6, 317.9, 450, 428/698; 264/29.1, 44, 610; 55/282.2, 282.3; 501/84

See application file for complete search history.

(56) References Cited

U.S. PATENT DOCUMENTS 5,120,689 A * 6/1992 Birchall et al. ................. 501/99
5,283,019 A * 2/1994 Atwell et al. ................. 264/44

(Continued)

FOREIGN PATENT DOCUMENTS

EP 0713248 A2 * 5/1996

(Continued)

*Primary Examiner*—William P Watkins, III
(74) *Attorney, Agent, or Firm*—Birch, Stewart, Kolasch & Birch, LLP

(57) ABSTRACT

A conductive porous material includes a matrix having a sintered compact of an oxide, a communicating opening formed in the matrix, having a small diameter and being permeable to gas and impermeable to substance other than gas, and a conductive layer provided on an internal wall of the communicating opening and receiving a current to generate heat. As conductive material is used, an organic substance adheres on the internal wall of communicating opening. To address this, conductive layer is caused to generate heat to decompose and thus remove the organic substance and thus prevent the communicating opening from clogging.

9 Claims, 4 Drawing Sheets

U.S. PATENT DOCUMENTS

| | | | |
|---|---|---|---|
| 5,423,904 A * | 6/1995 | Dasgupta | 96/146 |
| 7,287,975 B2 * | 10/2007 | Bandoh et al. | 425/470 |
| 2003/0052428 A1 | 3/2003 | Uemoto et al. | |
| 2006/0093693 A1 * | 5/2006 | Kuno et al. | 425/129.1 |
| 2006/0141159 A1 | 6/2006 | Okuda et al. | |

FOREIGN PATENT DOCUMENTS

| | | |
|---|---|---|
| JP | 8-192438 A | 7/1996 |
| JP | 2003-95764 A | 4/2003 |
| JP | 2003-137670 A | 5/2003 |
| JP | 2004-25677 A | 1/2004 |
| TW | 200502084 | 1/2005 |

* cited by examiner

CONDUCTIVE POROUS MATERIAL, RESIN MOLDING DIE EMPLOYING THE SAME, AND METHOD OF PREPARING CONDUCTIVE POROUS MATERIAL

TECHNICAL FIELD

The present invention relates to conductive porous materials, resin molding dies composed of conductive porous material, and methods of preparing conductive porous material.

BACKGROUND ART

Conventionally, a semiconductor chip mounted on a lead frame or a printed circuit board or the like (hereinafter simply referred to as a "substrate") is sealed with resin by employing resin-molding referred to as transfer mold. In transfer mold, a resin molding die is employed.

For the resin molding die, porous material can also be used. The porous material includes a filter layer capable of introducing air into the die or exhausting air from the die, as described in Patent Document 1. The filter layer has an air vent having a ventilating opening connected for example to a pump. The air vent has a surface connected to a surface of the die that has a communicating opening communicating with the ventilating opening. When the communicating opening is exposed to flowable resin the communicating opening prevents the flowable resin from flowing into the ventilating opening and permits the gas in the die to flow into the ventilating opening.

Furthermore, the resin molding die overlies a heater heating the flowable resin, composed of thermosetting resin, approximately at 180° C. to set the flowable resin to provide set resin. Consequently, the set resin seals the semiconductor chip mounted on the substrate.

A conventional resin molding die employing the above described conductive porous material has the following effects:

Initially, air or similar gas in a cavity can be externally exhausted. This can provide a resin molded product internally free of air bubbles or the like. Furthermore, after resin-molding when a molded product is released from the die, gas of high pressure is externally injected into the cavity. This can eliminate the necessity of employing an ejector pin to release the molded product from a molding surface.

Patent Document 1: Japanese Patent Laying-Open No. 8-192438 (pages 6-10, and FIGS. 5, 7 and 10)

DISCLOSURE OF THE INVENTION

Problems to be Solved by the Invention

The above described conventional technique, however, has the following disadvantages:

First, there is a problem attributed to the fact that the flowable resin generates gas containing not only air but also a component composed of an organic substance. This component adheres to a surface of the porous material, i.e., the molding surface and the communicating opening's internal wall. As resin molding proceeds, the accretion reduces the communicating opening's area in cross section and also impairs the molding surface's releaseability. This reduces the effect of externally exhausting the gas and that of injecting air of high pressure into the cavity to eject a molded product. Ultimately, the communicating opening is clogged.

Second, it is difficult to remove the accretion clogging the communicating opening. The accretion is composed of organic substance. As such, when it is heated at high temperature it is decomposed and thus removed. On the other hand, the heater arranged under the resin molding die is provided for the purpose of heating and thus setting the flowable resin in the cavity approximately at 180° C. In other words, the heater is not intended to generate a high temperature allowing the accretion to decompose. It is thus difficult to use the heater to remove the accretion. If the heater is modified to generate a temperature higher than 180° C., the heater is able to heat the accretion to remove it. However, decomposing the accretion by a heater requires a long period of time and the resin mold is inefficiently produced.

Third, the heater is arranged under the die and thus inefficiently heats and sets the flowable resin in the cavity. More specifically, while the cavity's molding surface needs to be heated to approximately 180° C., a significant portion of the heat generated by the heater is consumed to heat a member existing between the heater and the molding surface. As such, excessive energy and time will be consumed before the molding surface is heated to approximately 180° C. Consequently, reduced energy consumption or energy conservation can hardly be achieved and the resin molded product is inefficiently produced.

The present invention has been made to address the above disadvantages and it contemplates a conductive porous material preventing a communicating opening from being clogged with accretion, and a method of preparing the material. The present invention also contemplates a resin molding die that can achieve energy conservation and produce a resin mold more efficiently even when the conductive porous material is used.

Means for Solving the Problems

The present conductive porous material includes: a matrix having a sintered compact of an oxide; a communicating opening formed in the matrix, having a small diameter and being permeable to gas and impermeable to substance other than gas; and a conductive layer provided on an internal wall of the communicating opening and receiving a current to generate heat.

In the above arrangement the conductive layer can be caused to generate heat to decompose and remove an accretion on the internal wall of the communicating opening. This ensures the communicating opening's ventilation. Furthermore, as the conductive porous material is conductive, the material can be electroerosively processed for higher precision.

Furthermore in the present conductive porous material as described above desirably the conductive layer contains at least any of carbide, nitride and boride.

Furthermore in the present conductive porous material as described above desirably the communicating opening is formed by a gas generated by a reaction between the oxide and a different substance and flowing out.

In the above arrangement the conductive porous material can have conductive openings having a uniform diameter that are uniformly distributed throughout the material.

Furthermore the present resin molding die includes a conductive porous material and has a cavity, and sets a flowable resin in the cavity to provide a molded product. The resin molding die includes: a matrix having a sintered compact of an oxide; a communicating opening formed in the matrix to allow the resin molding die to have a molding surface with an opening, having a small diameter and being permeable to gas and impermeable to substance other than gas; and a conductive layer provided on an internal wall of the communicating opening and receiving a current to generate heat.

In the above arrangement the conductive porous material is used so that if an accretion is produced in the communicating opening the accretion can be removed from the communicating opening. The opening can thus be prevented from clogging. As a result, a resin molding die contributing to energy conservation and allowing resin to be molded more efficiently, can be obtained.

Furthermore in the present resin molding die as described above desirably the conductive layer contains at least any of carbide, nitride and boride.

Furthermore in the present resin molding die as described above desirably the communicating opening is formed by a gas generated by a reaction between the oxide and a different substance and flowing out.

In the above arrangement the resin molding die containing the conductive porous material can have communicating openings uniformly distributed therein.

Furthermore desirably the present resin molding die as described above further includes: a current generator passing a current through the conductive porous material to cause the conductive layer to generate heat; and a controller controlling the current generator to cause the conductive porous material to reach a temperature allowing the flowable resin to set or a temperature allowing a substance adhering on an internal wall of the communicating opening to evaporate.

The above arrangement allows the resin molding die itself to emit heat efficiently.

Furthermore the present method of preparing a conductive porous material is employed to prepare a conductive porous material including a matrix having a sintered compact of an oxide, a communicating opening formed in the matrix, having a small diameter and being permeable to gas and impermeable to substance other than gas, and a conductive layer provided on an internal wall of the communicating opening and receiving a current to generate heat. The method includes the steps of: mixing the oxide and a substance including at least any of carbon and boron at a prescribed ratio to provide a mixture; drying the mixture; sizing the mixture dried; molding the mixture sized; and firing the mixture molded, in a vacuumed atmosphere or a controlled nitrogen atmosphere. In the step of firing, a gas generated by a reaction between the oxide and a different substance flows out to form the communicating opening, and in the reaction a conductive substance adheres on an internal wall of the communicating opening to deposit the conductive layer.

In the above described method when the conductive porous material is produced a communicating opening having a uniform diameter and a conductive layer deposited on the internal wall of the communicating opening can be provided in the same step.

The foregoing and other objects, features, aspects and advantages of the present invention will become more apparent from the following detailed description of the present invention when taken in conjunction with the accompanying drawings.

DESCRIPTION OF THE REFERENCE SIGNS

1: conductive porous material, 2: matrix, 3: communicating opening, 4: conductive layer, 5A, 5B: resin molding die, 6A, 6B: top die (resin molding die), 7: bottom die, 8: substrate, 9: chip, 10: wire, 11: cavity, 12: resin flow path, 13: through hole, 14: cavity block, 15: block for fixture, 16: recess, 17: ventilating opening, 18: piping, 19: suction pump, 20: wiring, 21: power supply (current generator), 22: controller, 23: high pressure gas source, 24: air of high pressure, 25: molded product, 26: oxide particles (oxide), 27: carbon particles, 28: CO gas (generated gas).

Best Modes for Carrying Out the Invention

Hereinafter reference will be made to the drawings to describe a conductive porous material, a resin molding die employing the material, and a method of preparing the material in an embodiment of the present invention.

First Embodiment

Figure 1:
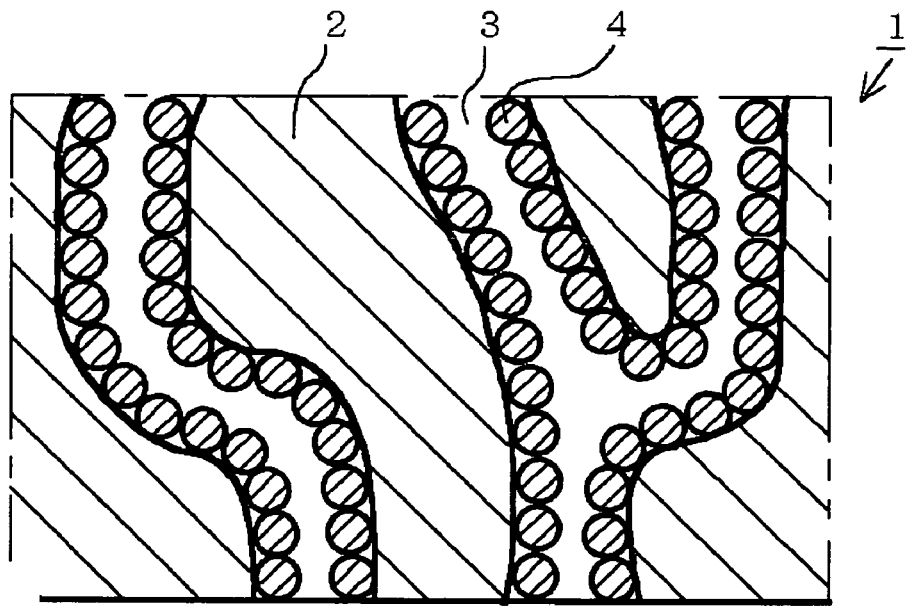
FIG. 1 is a cross section schematically showing a conductive porous material in an embodiment.
Figure 2:
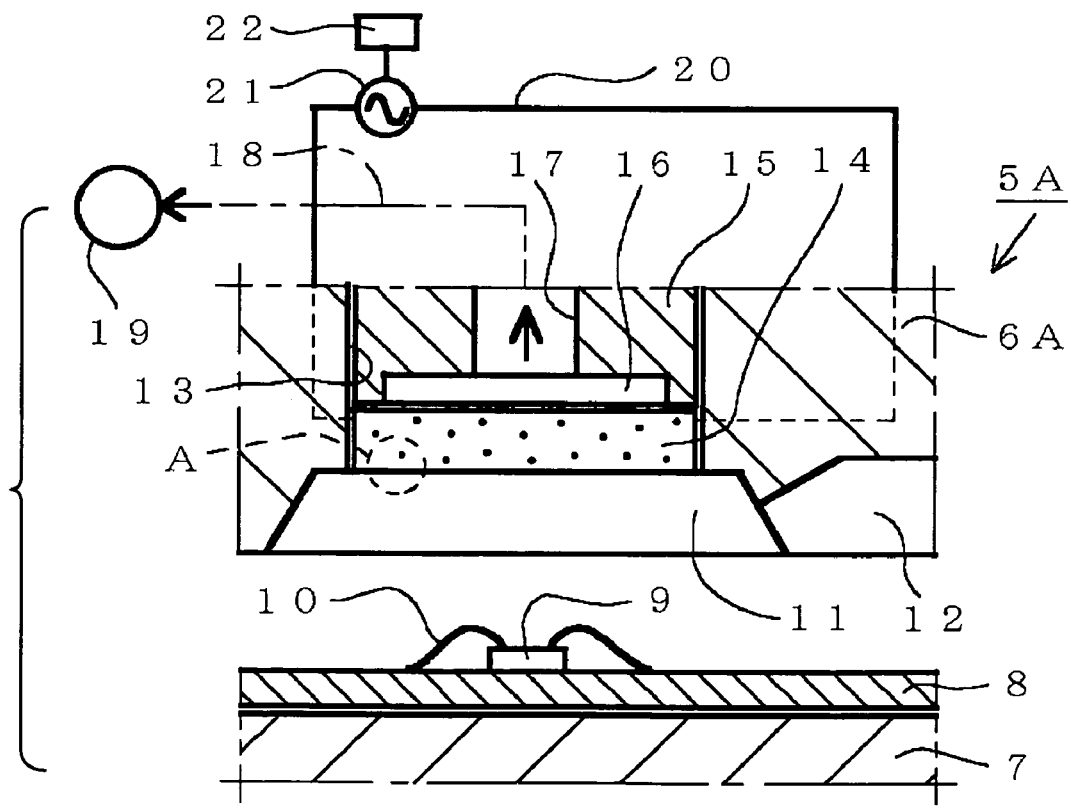
FIG. 2 is a cross section schematically showing a resin molding die employing the FIG. 1 conductive porous material.

Initially reference will be made to FIGS. 1 and 2 to describe a conductive porous material in the present embodiment and a resin molding die employing the material. FIG. 1 shows the conductive porous material of the present embodiment and FIG. 2 shows the resin molding die employing the FIG. 1 material. Note that both figures are exaggerated for the purpose of simplifying the description.

As shown in FIG. 1, the present invention provides a conductive porous material 1 including a matrix 2 and a communicating opening 3 that is formed to allow matrix 2 to have a surface having an opening, has a small diameter, and is permeable to gas and impermeable to substance other than gas. Communicating opening 3 has an internal wall provided with a conductive layer 4 in the form of a layer or adjacent particles generating heat as it passes a current.

Conductive layer 4 passing a current generates heat to allow conductive porous material 1 to reach a temperature required to accommodate a purpose of use. Such purpose for example includes setting a flowable resin contacting conductive porous material 1, or evaporating a material adhering on an internal wall of communicating opening 3.

Conductive porous material 1 is composed of components as will now be described. Material 2 is a sintered compact of $ZrO_2$ or similar oxide. Conductive layer 4 is formed of ZrC or similar carbide. Furthermore, conductive porous material 1 is specifically composed as follows:

Matrix 2 is an insulator and conductive layer 4 is a conductor. Furthermore, communicating opening 3 has an average diameter of 10 nm-100 nm. Furthermore, conductive porous material 1 as a whole has a resistivity of approximately $1.0 \times 10^{-6}$ $\Omega \cdot cm$ to $1.0 \times 10^{-1}$ $\Omega \cdot cm$, a degree of ventilation of $1.0 \times$ $10^{-16}$ m$^2$ to $1.0 \times 10^{-12}$ m$^2$, a porosity of 20 vol % to 60 vol %, and a compression strength of 50 MPa to 300 MPa. Note that a degree of ventilation indicates a flow rate of nitrogen gas receiving a constant differential pressure via a gas permeation apparatus that is measured at room temperature and converted in accordance with Darcy's law.

The aforementioned FIG. 1 conductive porous material 1 has ventilation ensured by communicating opening 3. Furthermore, if organic substance adheres on an internal wall of communicating opening 3, conductive layer 4 generating heat allows the organic substance to be decomposed by the heat and thus removed from communicating opening 3.

With reference to FIGS. 1 and 2, the present invention provides a resin molding die, as will now be described hereinafter. The present embodiment provides a resin molding die 5A including mutually opposite top and bottom dies 6 and 7. Bottom die 7 bears a substrate 8. On substrate 8 is mounted a chip 9 such as a semiconductor chip or similar electronic component. Substrate 8 and chip 9 have their respective electrodes electrically connected by wiring 10. Top die 6A has a cavity 11 providing a space accommodating chip 9 and wiring 10, and a resin path 12 communicating with cavity 11. As will be described later, a flowable resin is introduced via resin path 12 into cavity 11. The flowable resin is set to provide a set resin molded product.

Furthermore, top die 6A has a through hole 13 extending from a top side of cavity 11 upward. Internal to through hole 13 is fit a cavity block 14 formed of the FIG. 1 conductive porous material 1 and having a bottom surface forming a portion of the top side of cavity 11. In other words, an enlarged view of a portion indicated in FIG. 2 by a reference character A corresponds to FIG. 1.

Furthermore, through hole 13 is also internally provided with a block for fixture 15 fixed to top die 6A and defining a top surface of cavity block 14 positionally. Block 15 has a recess 16 in a surface contacting the top surface of cavity block 14. Recess 16 is connected via a ventilating opening 17 and then a piping 18 to a suction pump 19. Cavity block 14 is connected by a wiring 20 to a power supply 21 connected to a controller 22. Power supply 21 supplies cavity block 14 with a current, which passes through conductive layer 4 provided on the internal wall of communicating opening 3 of conductive porous material 1. As a result, conductive layer 4 generates heat. Furthermore, controller 22 controls power supply 21, as required, so that conductive porous material 1 reaches a temperature allowing the flowable resin to set or a substance adhering on the internal wall of communicating opening 3 to evaporate.

The FIG. 2 resin molding die 5A operates, as will be described hereinafter.

Initially, controller 22 controls power supply 21. Thus cavity block 14 generates heat. As a result, cavity block 14 and top die 6A attains a temperature allowing the flowable resin to set. Thus in the present embodiment cavity block 14 forming a portion of a molding surface of cavity 11 generates heat itself. This allows top die 6A to reach a prescribed temperature in a shorter period of time and with smaller energy than a conventional resin molding die utilizing heat generated by a heater arranged remote from cavity 11.

Then top and bottom dies 6A and 7 are closed together and suction pump 19 sucks air present in an interior of cavity 11 via the cavity block 14 communicating opening 3 (see FIG. 1) and ventilating opening 17 (see FIG. 2), and the flowable resin (not shown) is also introduced through resin path 12 into cavity 11. This can degas the flowable resin. More specifically, the flowable resin contains gas, which is exhausted external to cavity 11 sequentially through recess 16, ventilating opening 17 and piping 18 together with the gas present internal to cavity 11. Furthermore, the cavity block 14 communicating opening 3 is permeable to gas and impermeable to substance other than gas. This can prevent resin, a filler or similar particles contained in the flowable resin from entering communicating opening 3. As such, communicating opening 3 will not have set resin therein. This can contribute to enhanced releaseability between the molding surface of cavity 11 and a molded product (not shown). Note that in this process if suction pump 19 does not provide suction the flowable resin's pressure as it is introduced exhausts through communicating opening 3 the gas contained in the flowable resin and that present internal to cavity 11.

After cavity 11 has received the flowable resin, cavity block 14 still generates heat. The flowable resin thus sets. Top and bottom dies 6A and 7 are opened and a molded product composed of the set resin and substrate 8 integrated together is ejected from top die 6A by an ejecter pin.

Note that in the present embodiment the resin molding die can inject air or similar gas of high pressure from a high-pressure gas source (not shown) sequentially through piping 18, ventilating opening 17, recess 16, and the cavity block 14 communicating opening 3 (see FIG. 1) into cavity 11. Employing the gas of high pressure to press a molded product can eliminate the necessity of using an ejecter pin to release the molded product from top die 6A. Furthermore, repeating the above described process allows a plurality of molded products to be successively produced.

Furthermore, when the flowable resin is degassed, a component composed of an organic substance contained in the gas adheres on the molding surface and the communicating opening 3 internal wall. As such, as resin molding proceeds, the accretion reduces the communicating opening 3 area in cross section and impairs the molding surface's releaseability. This impairs the effect of externally exhausting the gas contained in the flowable resin and the effect of injecting air of high pressure into cavity 11 to externally eject a molded product.

In that case, controller 22 controls power supply 21 to supply a current to conductive layer 4 on the internal wall of communicating opening 3 to cause cavity block 14 to generate heat. As a result, cavity block 14 reaches a temperature allowing the accretion on the molding surface and the communicating opening 3 internal wall to evaporate. Thus if an organic substance adheres on the internal wall of communicating opening 3 conductive layer 4 can be caused to generate heat to decompose and thus remove the organic substance and as a result prevent communicating opening 3 from clogging.

Thus in the present embodiment the resin molding die can provide the following effects:

First, communicating opening 3 can have an interior free of set resin. This can contribute to enhanced releaseability between the cavity 11 molding surface and a molded product.

Second, cavity block 14 can generate heat to cause conductive layer 4 to generate heat. This can recover the effect of externally exhausting gas contained in the flowable resin and the effect of injecting air of high pressure into cavity 11 to externally eject a molded product.

Third, conductive porous material 1 having a compression strength of 50 MPa to 300 MPa forms cavity block 14. This can provide a resin molding die that can sufficiently endure pressure attributed to flowable resin and compressive stress caused when the flowable resin sets.

Fourth, cavity block 14 forming a portion of cavity 11 can be caused to generate heat itself. This allows top die 6A to reach a prescribed temperature in a reduced period of time and with reduced energy.

Figure 3:
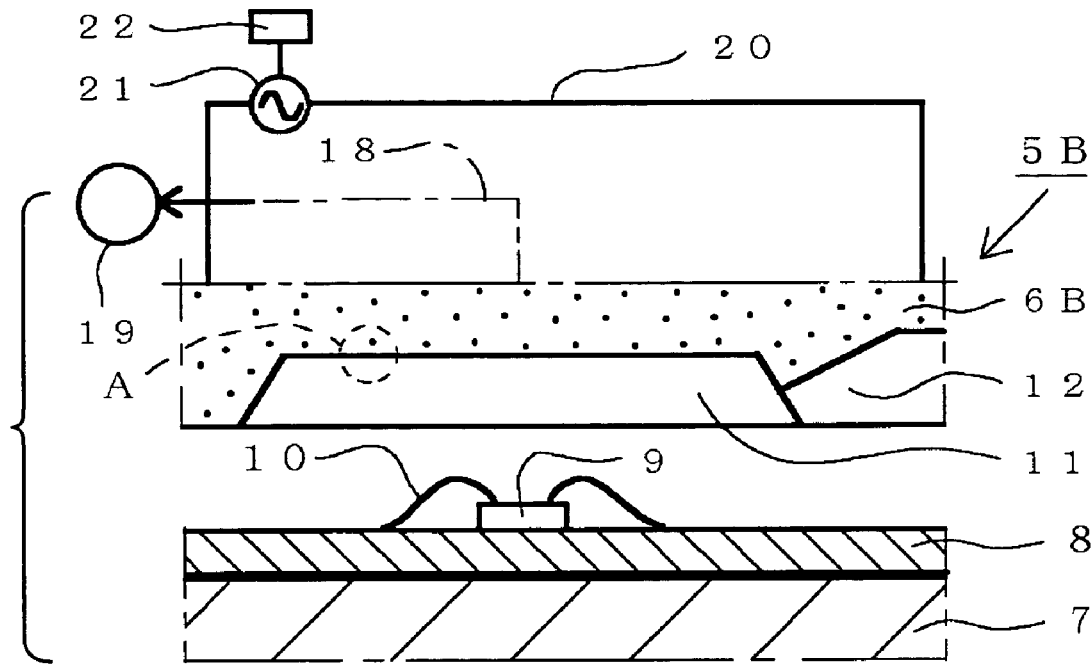
FIG. 3 schematically shows an exemplary variation of the resin molding die employing the FIG. 1 conductive porous material.
Figure 4:
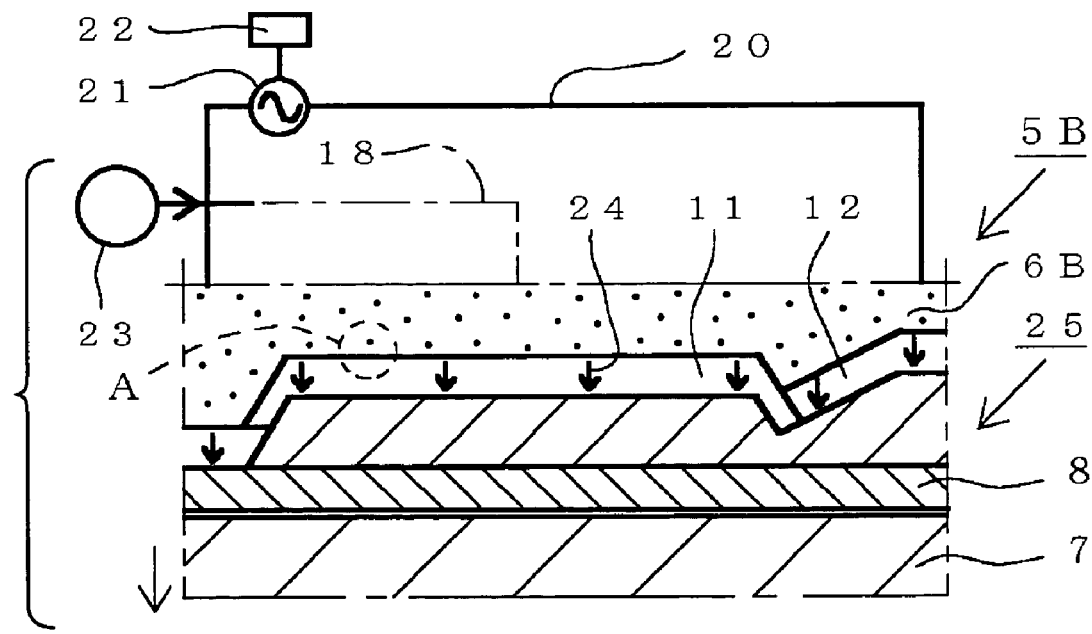
FIG. 4 is a cross section for schematically illustrating the FIG. 3 die ejecting a molded product.

Note that while in the present embodiment cavity block 14 fixed in top die 6A is formed of conductive porous material 1, the present invention's resin molding die is not limited thereto and may be configured as shown in FIGS. 3 and 4 as an exemplary variation.

FIGS. 3 and 4 schematically show a resin molding die employing conductive porous material as an exemplary variation, and how the resin molding die ejects a molded product, respectively. In the resin molding die as the exemplary variation, as shown in FIGS. 3 and 4, that portion of resin molding die 5A which contacts flowable resin, i.e., a top die 6B is entirely formed of conductive porous material 1. This further effectively allows top die 6B to reach a prescribed temperature in a reduced period of time and with reduced energy, the gas contained in the flowable resin to be externally exhausted, and high pressure air 24 to be injected from high-pressure gas source 23 into cavity 14 to eject a molded product 25.

Second Embodiment

Figure 5:
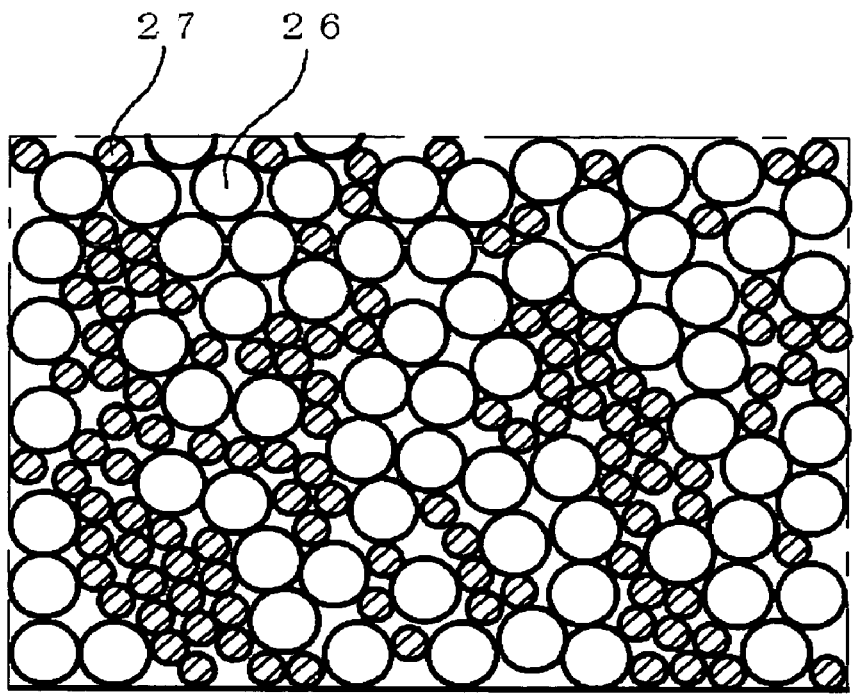
FIG. 5 is a cross section for schematically showing a source material of the conductive porous material in the embodiment.
Figure 6:
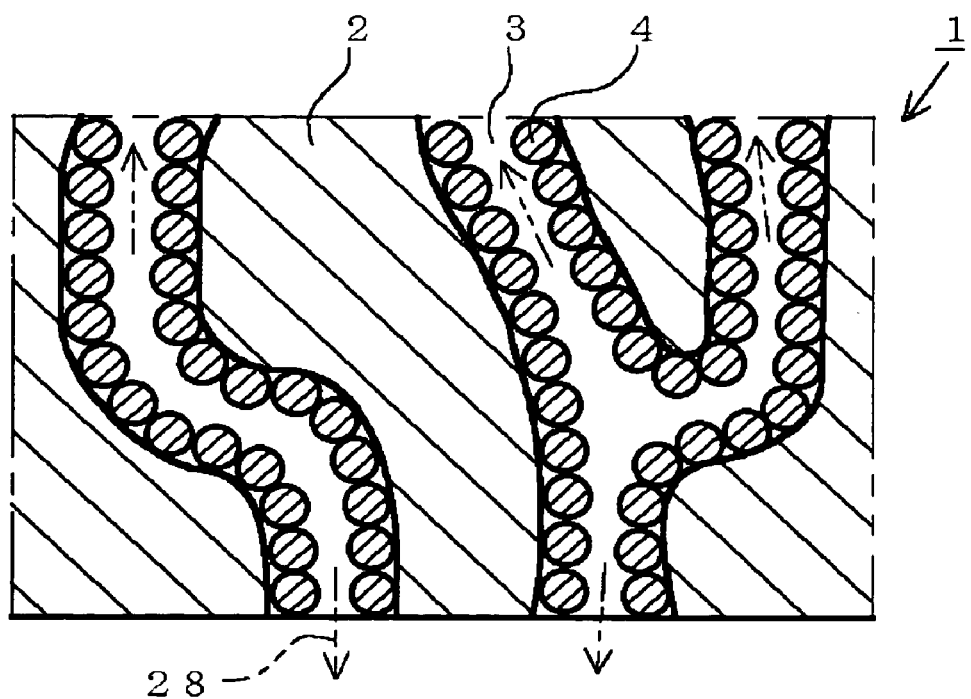
FIG. 6 is a cross section for schematically illustrating a conductive porous material produced from the FIG. 5 material.
Figure 7:
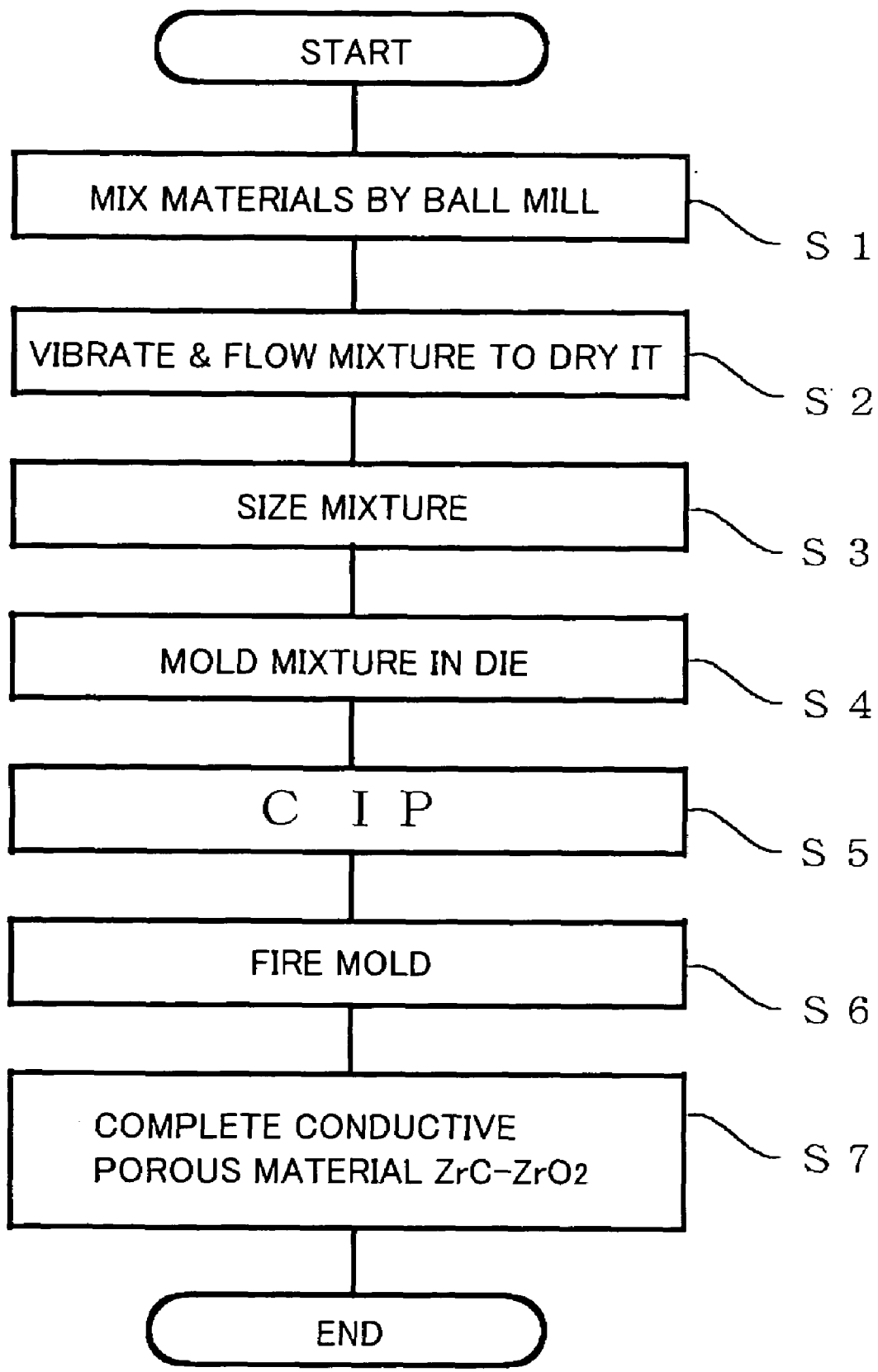
FIG. 7 is a flow chart for illustrating a method of preparing the conductive porous material in the embodiment.

With reference to FIGS. 5-7, the present embodiment provides a method of preparing the conductive porous material, as will be now described hereinafter. FIGS. 5 and 6 show a source material of the conductive porous material of the present invention, and the present conductive porous material. Note that the FIG. 6 material is identical to the FIG. 1 material. FIG. 7 is a flow chart of the method of preparing the conductive porous material in the present embodiment.

The FIG. 5 source material is composed for example of oxide particles 26 formed of $ZrO_2$ and carbon particles 27 mixed together at a prescribed ratio preferably falling in a range of oxide particles:carbon particles=55:45 (vol %) to 85:15 (vol %). Furthermore, oxide particle 26 contains a prescribed amount of $Y_2O_3$ (not shown) mixed together as a stabilizer. The FIG. 5 source material is processed through a process of a series of steps as shown in FIG. 7 to prepare the FIG. 6 conductive porous material 1.

FIG. 7 shows steps S1-S5 which are steps similar to those of typically firing ceramic material, as will now be described briefly hereinafter.

Initially at step S1 for example oxide particles 26 of $ZrO_2$ and carbon particles 27 are mixed together by a ball mill at a prescribed ratio. Then at step S2 the mixture obtained at step S1 is vibrated and flowed and thus dried. Then at step S3 a sieve having an appropriate mesh is employed to size the dried mixture. Then at step S4 a die employed to form a prescribed shape is employed to mold the sized mixture. Then at step S5 cold isostatic pressing (CIP) is employed to press the molded mixture.

Then at step S6 the pressed mixture is fired (or sintered) at a prescribed temperature for a prescribed period of time. In the present embodiment the pressed mixture is fired in a furnace having an atmosphere reduced in pressure, i.e., in a so-called vacuum. Furthermore, CO gas 28 generated in a reaction (carbon reduction reaction) represented by a chemical expression $ZrO_2+3C \rightarrow ZrC+2CO$ is exhausted from the source material while the intermediate product is fired. CO gas 28 exhausted provides a trail, which provides the fired, sintered compact, or conductive porous material 1, with communicating opening 3 having a uniform and small diameter. The present method allows communicating openings 3 having a uniform diameter of at most 1 μm to be distributed in conductive porous material 1 more uniformly than a conventional method of molding, degreasing, rendering porous, and firing a powdery mixture of conductive particles, a binder and a firing assistant.

Each communicating opening 3 has an internal wall having a conductive substance or carbide ZrC adhering thereon in the form of a layer or adjacent particles to serve as conductive layer 4. Furthermore, of $ZrO_2$ serving as a portion of source material, a portion that has not reacted with carbon C is sintered at step S6 to provide a sintered compact having a level of strength and remaining as matrix 2, a skeleton of conductive porous material 1. Thus, in the present method, matrix 2 having a level of strength, communicating opening 3 having a uniform diameter and uniformly distributed, and conductive layer 4 produced on an internal wall of communicating opening 3 are provided at the same step S6.

Then at step S7 conductive porous material 1 is ejected from the furnace. Conductive porous material 1 formed of a composite $ZrC-ZrO_2$, and having a desired shape thus completes. Thereafter if a more precise shape is required then the conductivity of conductive porous material 1 may be utilized to electroerosively machine conductive porous material 1 for higher precision. Thus top die 6B as shown for example in FIGS. 3 and 4 completes.

The source material composed of oxide and carbon particles 26 and 27 that are modified in grain size, mixed together at a modified ratio, and fired under a modified condition or the like can also provide conductive porous material 1. This allows communicating opening 3 to have a modified average diameter, and the porous material as a whole to be modified in resistively, degree of ventilation, porosity and compression strength. In other words, by modifying a material, a firing condition and/or the like, a conductive porous material different in specification can be produced.

Note that in the present embodiment oxide particle 26 of $ZrO_2$ is employed and a trail of CO gas 28 generated by a carbon reduction reaction between oxide particle 26 and carbon particle 27 forms communicating opening 3. Furthermore, carbide ZrC adhering on an internal wall of each communicating opening 3 serves as conductive layer 4. Note that oxide particle 26 combined with carbon particle 27 is not limited to $ZrO_2$ and may be at least any of $TiO_2$, $Cr_2O_3$, $WO_3$, $MoO_3$ and the like. If these oxides' particles are used then as a carbide forming conductive layer 4 at least any of TiC, $Cr_3C_2$, WC, $Mo_2C$ and the like, respectively, is produced.

Furthermore, oxide particle 26 formed of at least any of $TiO_2$, $Cr_2O_3$, $ZrO_2$, $Nb_2O_5$ and the like may be reacted with nitrogen in an atmosphere with the nitrogen controlled in partial pressure to produce at least any of conductive nitrides TiN, $Cr_2N$, ZrN, NbN and the like to form conductive layer 4. Furthermore, oxide particle 26 formed of $TiO_2$, $Cr_2O_3$, $ZrO_2$, $Nb_2O_5$, $Ta_2O_5$, $WO_3$, $MoO_3$ or the like may be borided ($B_2O_3$+Carbon) to produce conductive borides $TiB_2$, $CrB_2$, $ZrB_2$, $NbB_2$, $TaB_2$, WB, MoB or the like to form conductive layer 4. In any of the above described cases, gas generated in at least any of carbon reduction reaction, nitridation reaction and boridation reaction flows out to form communicating opening 3 in matrix 2.

Furthermore in the above described embodiment the resin molding die employs power supply 21 to directly supply conductive porous material 1 with a current to generate Joule heat in conductive layer 4 deposited on an internal wall of communicating opening 3. However, the present resin molding die is not limited thereto and the conductance of conductive porous material 1 may be utilized so that induction heating (IH) allows conductive layer 4 to generate heat. In that case, top die 6A, the block for fixture 15 and bottom die 7 are desirably provided with a coil. Furthermore, a member inserted between top die 6A, 6B and bottom die 7 may be provided with a coil. Such arrangements allows the coil to function as a current generator as the conductive porous material 1 conductive layer 4 has a current flowing therethrough.

Furthermore, if necessary, conductive porous material 1 may have a surface provided with a protection film formed of a glass material, a ceramic material or similar inorganic material, or silicone resin, fluororesin or similar organic material to prevent communicating opening 3 from being clogged. The protection film serves as an insulation film as well as serves to protect the surface of conductive porous material 1, limit heat transmission from conductive porous material 1 to a different member to help to generate heat more efficiently, and contribute to increased releaseability between the molding surface and set resin.

Furthermore, while top die 6A, 6B is provided with conductive porous material 1, the present resin molding die is not limited thereto, and bottom die 7, or both top die 6A, 6B and bottom die 7 may be provided with conductive porous material 1. In that case, with bottom die 7 provided with conductive porous material 1, substrate 8 may be attracted to and thus fixed on a molding surface and also heated.

Furthermore in the present embodiment the resin molding die is described as that resin-sealing semiconductor chip 9 mounted on substrate 8. However, the present resin molding die is not limited thereto and may be those used in transfer molding, injection molding or similar resin molding.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A conductive porous material comprising:
   a matrix having a sintered compact of an oxide;
   a communicating opening formed in said matrix, having a small diameter and being permeable to gas and impermeable to substance other than gas; and
   a conductive layer, in the form of a layer or with adjacent particles in contact with each other, provided on an internal wall of said communicating opening and passing a current to generate heat.

2. The conductive porous material according to claim 1, wherein said conductive layer contains at least any of carbide, nitride and boride.

3. The conductive porous material according to claim 1, wherein said communicating opening is formed by a gas generated by a reaction between said oxide and a different substance and flowing out.

4. A resin molding die including a conductive porous material and having a cavity, setting a flowable resin in the cavity to provide a molded product, the resin molding die comprising:
   matrix having a sintered compact of an oxide;
   a communicating opening formed in said matrix to allow the resin molding die to have a molding surface with an opening, having a small diameter and being permeable to gas and impermeable to substance other than gas; and
   a conductive layer, in the form of a layer or with adjacent particles in contact with each other, provided on an internal wall of said communicating opening and passing a current to generate heat.

5. The resin molding die according to claim 4, wherein said conductive layer contains at least any of carbide, nitride and boride.

6. The resin molding die according to claim 4, wherein said communicating opening is formed by a gas generated by a reaction between said oxide and a different substance and flowing out.

7. The resin molding die according to claim 4, further comprising:
   a current generator passing a current through said conductive porous material to cause said conductive layer to generate heat; and
   a controller controlling said current generator to cause said conductive porous material to reach a temperature allowing said flowable resin to set or a temperature allowing a substance adhering on an internal wall of said communicating opening to evaporate.

8. A method of preparing a conductive porous material including a matrix having a sintered compact of an oxide, a communicating opening formed in said matrix, having a small diameter and being permeable to gas and impermeable to substance other than gas, and a conductive layer provided on an internal wall of said communicating opening and passing a current to generate heat, the method comprising the steps of:
   mixing said oxide and a substance including at least any of carbon and boron at a prescribed ratio to provide a mixture;
   drying said mixture;
   sizing said mixture dried;
   molding said mixture sized; and
   firing said mixture molded, in a vacuumed atmosphere or a controlled nitrogen atmosphere, wherein in the step of firing, a gas generated by a reaction between said oxide and a different substance flows out to form said communicating opening, and in said reaction a conductive substance adheres on an internal wall of said communicating opening to deposit said conductive layer in the form of a layer or with adjacent particles in contact with each other.

9. The conductive porous material according to claim 2, wherein said communicating opening is formed by a gas generated by a reaction between said oxide and a different substance and flowing out.

* * * * *

UNITED STATES PATENT AND TRADEMARK OFFICE
CERTIFICATE OF CORRECTION

PATENT NO. : 7,732,037 B2  Page 1 of 1
APPLICATION NO. : 10/557003
DATED : June 8, 2010
INVENTOR(S) : Takaki Kuno et al.

It is certified that error appears in the above-identified patent and that said Letters Patent is hereby corrected as shown below:

ON THE TITLE PAGE:

At item (73), Assignees, change:

"Towa Corporation, Kyoto (JP); Japan Fine Chemicals Center, Aichi (JP)"

to

-- Towa Corporation, Kyoto (JP); Japan Fine Ceramics Center, Aichi (JP) --.

Signed and Sealed this

Fourteenth Day of December, 2010

David J. Kappos
*Director of the United States Patent and Trademark Office*